United States Patent [19]

Lindmayer

[11] 4,349,691

[45] Sep. 14, 1982

[54] METHOD OF MAKING CONSTANT VOLTAGE SOLAR CELL AND PRODUCT FORMED THEREBY UTILIZING LOW-TEMPERATURE ALUMINUM DIFFUSION

[75] Inventor: Joseph Lindmayer, Rockville, Md.

[73] Assignee: Solarex Corporation, Rockville, Md.

[21] Appl. No.: 143,780

[22] Filed: Apr. 25, 1980

Related U.S. Application Data

[63] Continuation of Ser. No. 784,909, Apr. 5, 1977, abandoned.

[51] Int. Cl.$^3$ .................. H01L 21/225; H01L 21/24
[52] U.S. Cl. ...................... 136/261; 29/572; 29/590; 148/177; 148/178; 148/188; 357/30; 357/65; 357/67; 427/74; 427/90; 427/91; 427/376.7
[58] Field of Search .............. 29/572, 590; 148/177, 148/178, 187, 188; 136/255, 256, 261; 427/90, 91, 74, 376; 357/30, 65, 67

[56] References Cited

U.S. PATENT DOCUMENTS

| | | | |
|---|---|---|---|
| 3,108,359 | 10/1963 | Moore et al. | 29/590 |
| 3,217,401 | 11/1965 | White | 29/590 |
| 3,266,127 | 8/1966 | Harding et al. | 29/590 X |
| 3,382,568 | 5/1968 | Kuiper | 29/590 X |
| 3,772,768 | 11/1973 | Fischer et al. | 29/572 |
| 3,895,975 | 7/1975 | Lindmayer | 136/261 X |
| 4,056,879 | 11/1977 | Lindmayer | 29/572 |
| 4,106,047 | 8/1978 | Lindmayer | 136/255 |
| 4,137,095 | 1/1979 | Lindmayer | 148/188 X |

OTHER PUBLICATIONS

Loferski et al., "Theoretical-Photovoltaic Cells", IEEE Photospecialists Conf. Record #10, Nov. 1973, pp. 58-63.

Sudbury et al., "Aluminum Contact-for Silicon Solar Cells", IEEE Photospecialists Conf., 5th Conf., Nov. 1968, pp. 66-69.

*Primary Examiner*—L. Dewayne Rutledge
*Assistant Examiner*—W. G. Saba
*Attorney, Agent, or Firm*—Watson, Cole, Grindle & Watson

[57] ABSTRACT

A method of making a silicon solar energy cell having a substantially constant voltage despite significant increases in illumination, in which the back surface junction of the cell is formed by aluminum alloying at relatively low temperatures.

8 Claims, No Drawings

METHOD OF MAKING CONSTANT VOLTAGE SOLAR CELL AND PRODUCT FORMED THEREBY UTILIZING LOW-TEMPERATURE ALUMINUM DIFFUSION

This is a continuation of application Ser. No. 784,909 filed Apr. 5, 1977, now abandoned.

In the manufacture of silicon solar energy cells, an impurity is diffused into a wafer of silicon that has previously been doped with an impurity of opposite polarity. Thus, for n-p type silicon solar cells, the diffusion process usually employs compositions of phosphorus or arsenic where the silicon wafer that is the precursor of the cell has been doped with, e.g., boron. After an electrical junction has been established in the wafer, contacts are applied to the front surface of the cell, which is adapted to absorb light impinging thereon and therby generate an electrical current, and to the back, non-exposed surface of the wafer. Since diffusion normally takes place before contacts are applied, it is necessary either to protect the back surface of the silicon wafer during diffusion or later to eradicate the undesirable junction that has been formed at the back surface.

An important solution to the problem of making unnecessary the protection of the back surface of the silicon wafer during diffusion is disclosed in my U.S. Pat. No. 3,990,097, issued Nov. 2, 1976. A divisional application having the same disclosure as said patent is presently pending under Application Ser. No. 705,063, which divisional application has a filing date of July 14, 1976. In such patent and application, a method and product are disclosed whereby the back surface of the wafer is not protected during diffusion, but metallic aluminum is applied over the layer of diffusant glass formed on the back surface after diffusion. This coating of aluminum is then alloyed through the glass and reverses the polarity of the diffusant junction formed inwardly of the back surface of the wafer. Further, the aluminum coating may be used as the back contact for the cell, itself, and an aluminum back contact has been found most useful in silicon solar energy cells.

A specific application has now arisen with respect to an aluminum or other metallic coating alloyed to the back surface of a silicon wafer, whether or not that layer has been applied to a layer of diffusant glass in accordance with the method and product of my previous patent and application, or directly to the back surface of the wafer, which back surface has been protected during diffusion or from which the diffusant glass formed on such back surface has been removed. The phenomenon has become particularly evident with respect to certain uses to which solar cells have found employment. One such use, for example, is to recharge batteries. In many of the applications to which solar cells have been put, an important utilization is to continuously apply a "trickle charge" to a battery that powers a device located far from more conventional sources of electricity. Thus, solar panels using a multiplicity of cells have found employment on oil and gas drilling rigs, and for recharging battery-powered microwave relay stations located at the peak of mountains.

Whether the battery being recharged is small or large, the possibility of overcharging the battery can present a serious hazard. While it is possible to use a voltage regulator to prevent overcharging, such a regulator increases expenses, may reduce efficiency of the overall system, and is simply another piece of equipment subject to corrosion and ultimately, to failure. Without the voltage regulator, the battery can be overcharged to the point of failure, indeed even to explosion. In any case, failure of the battery leads to inoperativeness of the load devices, e.g., the light on a buoy, or the operation of a solar powered watch or flashlight or pocket calculator.

In terrestrial uses of solar cells, it will, therefore, be apparent that it is widely desirable for a solar cell to maintain a substantially uniform voltage, since there will be wide variations in illumination present in ambient conditions. In outdoor conditions, cloud coverage and reflective surfaces present will vary by hundreds of times. Indoors, there will be similar variations from low light levels up to the multiple suns provided by a flashlight.

It is, consequently, a primary object of the present invention to provide a solar energy cell in which, once the desired voltage has been reached, exposure to significantly increased illumination will not significantly increase the voltage generated by the cell to a level such that a device or battery powered by the cell will become inoperative. This object is accomplished not by a regulator circuit, but through the inherent electrical characteristics of the cell, which are thereby preserved even at low light levels.

For the purpose of the invention disclosed and claimed herein, I provide a method of making a constant voltage solar cell of otherwise conventional structure but having its back surface junction formed by aluminum alloying at a temperature below that at which aluminum alloying to form a back junction normally takes place.

While aluminum alloying may be conducted at a temperature above approximately 600° C., it has also been performed at higher temperatures. For example, in my said U.S. Pat. No. 3,990,097, I disclose a method of alloying an aluminum coating into the back surface of a silicon wafer through the diffusant glass coating formed on the wafer back surface after diffusion of an impurity into the wafer to form a front junction. The alloying temperature of that procedure was carried out at about 800° C. and results in the formation of a back junction having excellent electrical properties where the maximum voltage is desired under increased illumination. For the purposes of the present invention, however, where a substantially constant voltage is desired once a predetermined intensity of illumination has been reached, such a back junction has undesirable characteristics.

Therefore, the present invention is founded on the low-temperature alloying of aluminum to form a back junction for a silicon solar cell. Such alloying is carried out at or about the lowest temperature at which it will be effective to create a back junction in the wafer. It has been found that such minimal alloying temperature is in the region of 577° C., which is the eutectic point of silicon and aluminum. While it is not practical to perform the alloying step at a temperature too far below the eutectic point, it is possible to conduct the alloying at conditions wherein the temperature of the oven may be maintained in a range of 520° to 600° C., relying on local variation in the wafer to permit localized penetration of the wafer by the aluminum. The temperature may be increased above 577° C., up to about 600° C., with diminution of the constant voltage characteristics of the cell produced thereby, until those characteristics have been eliminated at alloying above about 600° C. At present, it has been found most preferable that alloying be carried out at a temperature in the proximity of the eutectic point, e.g., at about 577° C.

The time during which the low-temperature alloying of aluminum is carried out should be sufficient to enable a localized back junction to be formed in the wafer but insufficient to increase the penetration of the aluminum atoms into the interior of the wafer in such a continuous pattern as to defeat the purpose of the low-temperature alloying. So, while time will also vary somewhat in accordance with the specific temperature at which the alloying is carried out, it has been found that it will take about 10 minutes to provide a partial alloying, according to the present invention, when the temperature is about 560° to 580° C. The alloying time may be increased to 20 minutes at that temperature range, although the higher the temperature, the less desirable it becomes to maintain the temperature for extended periods of time.

In a preferred embodiment of the process of my invention, a silicon wafer having a boron impurity incoprorated therein as a dopant was diffused with phosphorus in the normal manner, to form layers of phosphor glass on the front and back surfaces of the wafer. A coating of aluminum approximately 5,000 A in thickness was applied to the back surface and the wafer subjected to heating for 10 minutes in an oven maintained at about 577° C. The wafer as alloyed was made into a solar cell with front and back contacts and exhibited substantially unchanged voltage with increased illumination once a light intensity of about 0.01 suns had been reached.

It will be understood that I have referred to my invention by specific recourse to a preferred embodiment thereof only for the purpose of illustrating that invention, and the alterations and modifications thereof will be obvious to those of skill in this art. As to such alterations and modifications, they are desired to be included within the purview of my invention, which is to be limited only by the scope, including equivalents, of the following, appended claims.

I claim:

1. A method of forming a back junction in an n-p solar energy cell having a front surface adapted to receive light impinging thereon and an opposed back surface, comprising applying a coating of aluminum to the back surface of the wafer, and heating the wafer at a temperature at about 520° to 600° C. for a period of time sufficient to cause the aluminum to penetrate the back surface and form a back junction in the wafer, so that when light impinges on the front surface of the wafer, the cell will generate electricity at a generally constant voltage over a substantial range of light intensities.

2. A method as claimed in claim 1, in which the coated wafer is heated at a temperature of about 540° to 580° C. for about 5 to 20 minutes.

3. A method as claimed in claim 1, in which the silicon wafer is impregnated with a dopant to form a front junction in a zone extending inwardly from the front surface of the wafer prior to coating the wafer back surface with aluminum.

4. A method as claimed in claim 3, in which prior to coating with aluminum the back surface of the wafer is covered with a layer of glass formed thereon, which layer is removed prior to coating of said back surface with aluminum.

5. A method as claimed in claim 4, in which the back surface glass layer is removed by etching.

6. A method as claimed in claim 3, in which prior to coating with aluminum the back surface of the wafer is covered with a layer of glass formed thereon, and the coating of aluminum is applied to said back surface glass layer.

7. A method of forming a back junction in an n-p solar cell having a front surface adapted to receive light impinging thereon and an opposed back surface, comprising applying a coating of aluminum to the back surface of the wafer, and heating the wafer at a temperature of about 577° C. for a period of time sufficient to cause the aluminum to penetrate the back surface and form a back junction in the wafer, so that when light impinges on the front surface of the wafer, the cell will generate electricity at a generally constant voltage over a substantial range of light intensities.

8. A silicon solar energy cell produced by the practice of the method of claim 1 or claim 6 or claim 7.

* * * * *